(12) United States Patent
Botker et al.

(10) Patent No.: US 8,130,000 B2
(45) Date of Patent: Mar. 6, 2012

(54) METHODS AND APPARATUS FOR BATTERY MONITORING

(75) Inventors: Tom Lloyd Botker, Andover, MA (US); Lawrence Craig Streit, Noblesville, IN (US)

(73) Assignee: Analog Devices, Inc., Norwood, MA (US)

( * ) Notice: Subject to any disclaimer, the term of this patent is extended or adjusted under 35 U.S.C. 154(b) by 872 days.

(21) Appl. No.: 12/074,141

(22) Filed: Feb. 29, 2008

(65) Prior Publication Data

US 2008/0238432 A1  Oct. 2, 2008

Related U.S. Application Data

(60) Provisional application No. 60/904,544, filed on Mar. 2, 2007.

(51) Int. Cl.
*G01N 27/416* (2006.01)
(52) U.S. Cl. .......... 324/433; 324/434; 324/429
(58) Field of Classification Search ........... 324/426–436
See application file for complete search history.

(56) References Cited

U.S. PATENT DOCUMENTS

| | | | |
|---|---|---|---|
| 5,099,205 A | 3/1992 | Lewyn | |
| 5,359,296 A | 10/1994 | Brooks et al. | |
| 5,677,077 A | 10/1997 | Faulk | |
| 5,841,996 A | 11/1998 | Nolan et al. | |
| 6,268,710 B1 * | 7/2001 | Koga | 320/116 |
| 6,313,637 B1 * | 11/2001 | Iino et al. | 324/434 |
| 6,362,626 B2 * | 3/2002 | Furukawa | 324/429 |
| 6,367,570 B1 * | 4/2002 | Long et al. | 180/65.26 |
| 6,639,408 B2 * | 10/2003 | Yudahira et al. | 324/434 |
| 6,762,588 B2 | 7/2004 | Miyazaki et al. | |
| 6,891,352 B2 | 5/2005 | Miyazaki et al. | |
| 7,859,223 B2 | 12/2010 | Gorbold | |
| 2003/0044689 A1 | 3/2003 | Miyazaki et al. | |
| 2004/0051534 A1 | 3/2004 | Kobayashi et al. | |
| 2004/0160229 A1 | 8/2004 | Fujita et al. | |
| 2005/0253559 A1 | 11/2005 | Felder | |

(Continued)

FOREIGN PATENT DOCUMENTS

WO  WO 96/21181 A  7/1996

OTHER PUBLICATIONS

Analog Devices, "*High Voltage Current Shunt Monitor*", Preliminary Technical Data, AD8212, pp. 1-8, 2006.

(Continued)

*Primary Examiner* — Samuel Berhanu
(74) *Attorney, Agent, or Firm* — Knobbe, Martens, Olson & Bear LLP

(57) ABSTRACT

A battery monitoring system is provided to monitor a battery stack having multiple cells connected in series. The monitoring system includes monitor modules to monitor respective subsets of the cells of the battery stack, each monitor module, in response to one or more control signals, measuring cell voltages of the respective subset of cells and providing at least one readout signal that represents the sampled cell voltages, the monitor modules being electrically connected in a stack such that each monitor module is referenced to the voltage of the respective subset of cells, and the control signals and the readout signal are connected through the monitor modules of the stack, and a system control unit to provide the control signals to the monitor modules and to receive the readout signals from the monitor modules.

16 Claims, 11 Drawing Sheets

U.S. PATENT DOCUMENTS

2007/0182375 A1 8/2007 Lee
2008/0180106 A1 7/2008 Gorbold

OTHER PUBLICATIONS

Shin-Kobe Electric Machinery Co., Ltd., "*Cell Controller for Lithium Ion Battery Using ASIC*", Shin-Kobe Technical Report No. 16 (Feb. 2006), pp. 16-20, 2006.

Search Report and Written Opinion mailed Jun. 10, 2008 from corresponding International Application No. PCT/US2008/002690.
Search Report and Written Opinion mailed Jun. 13, 2008 from International Application No. PCT/US2008/001312.
Office Action in counterpart European Application No. 08 726 261.4 dated Nov. 4, 2011, 3 pages.
Office Action in counterpart Chinese Application No. 200880010819.9, dated oct. 19, 2011, 11 pages (including translation).

* cited by examiner

METHODS AND APPARATUS FOR BATTERY MONITORING

CROSS REFERENCE TO RELATED APPLICATION

This application claims priority to Provisional Application Ser. No. 60/904,544, filed Mar. 2, 2007, which is hereby incorporated by reference in its entirety.

FIELD OF THE INVENTION

The present invention relates to battery monitoring methods and apparatus and, more particularly, to methods and apparatus for monitoring cells in a battery stack using low voltage monitoring circuitry.

BACKGROUND OF THE INVENTION

Rechargeable batteries are used in many applications. One such application is in hybrid vehicles. In these vehicles, a plurality of individual battery cells are connected in series to provide a battery stack having a desired output voltage. A large number of cells may be connected in series such that the total potential difference developed across the battery stack is on the order of 150-600 volts, for example.

In general, it is desirable to monitor the voltage, the impedance and the state of charge of each individual cell in the battery stack. An excessive voltage may indicate thermal runaway, in which the cell has the potential to catch on fire or to explode. A low voltage may indicate a discharged condition. A typical requirement is to measure all cell voltages in the battery stack and the battery stack current more or less simultaneously, i.e., within a few microseconds, and to repeat the measurement on the order of every 100 milliseconds. This permits the state of charge and the impedance of the cells in the battery stack to be determined accurately.

Techniques for monitoring low voltage batteries are known in the art. However, significant problems are presented in monitoring a battery stack of several hundred volts. It is desirable to implement a battery monitoring system with low voltage circuitry, such as circuitry that operates at or below 16-30 volts. In addition, it is desirable to avoid the need for multiple isolation devices such as optical isolators. Accordingly, there is a need for novel battery monitoring apparatus and methods.

SUMMARY OF THE INVENTION

According to a first aspect of the invention, a monitor module is provided to monitor a battery stack having multiple cells connected in series. The monitor module comprises sampling circuits to sample cell voltages of corresponding cells of at least a subset of the cells (sometimes known as a "brick") of the battery stack, a readout circuit to receive the sampled cell voltages of the corresponding cells of the subset of cells and to provide at least one readout signal that represents the sampled cell voltages, and a module control unit to provide simultaneous sample commands to the sampling circuits and to provide sequential read commands to the sampling circuits, in response to control signals.

In some embodiments, the monitor module may be used to perform one or more control functions, such as control of cells of the battery stack, in response to control signals. In further embodiments, the monitor module may have a low power mode for power saving during inactive periods. In additional embodiments, the monitor module may be configured to perform one or more diagnostic operations to verify proper functioning.

According to a second aspect of the invention, a battery monitoring system is provided to monitor a battery stack having multiple cells connected in series. The monitoring system comprises monitor modules to monitor respective subsets of the cells of the battery stack, each monitor module, in response to one or more control signals, measuring cell voltages of the respective subset of cells and providing at least one readout signal that represents the sampled cell voltages, the monitor modules being electrically connected in a stack such that each monitor module is referenced to the voltage of the respective subset of cells, and the control signals and the readout signal are connected through the monitor modules of the stack, and a system control unit to provide the control signals to the monitor modules and to receive the readout signals from the monitor modules.

According to a third aspect of the invention, a method is provided for monitoring a battery stack having multiple cells connected in series. The method comprises providing monitor modules to monitor respective subsets of the cells of the battery stack, referencing each monitor module to the voltage of the respective subset of cells, and connecting control signals and readout signals serially through the monitor modules.

According to a fourth aspect of the invention, a method is provided for monitoring a battery stack having multiple cells connected in series. The method comprises providing one or more monitor modules to monitor respective subsets of the cells of the battery stack, simultaneously sampling cell voltages of the cells of the battery stack with the one or more monitor modules, and sequentially reading the sampled cell voltages of the cells of the battery stack and providing at least one readout signal that represents the sampled cell voltages.

BRIEF DESCRIPTION OF THE DRAWINGS

For a better understanding of the present invention, reference is made to the accompanying drawings, which are incorporated herein by reference and in which.

DETAILED DESCRIPTION

The present invention allows small differential voltages, such as two to five volts, for example, from a series stack of battery cells to be measured using high common mode voltages, such as 300 to 600 volts for example. The measurement is accomplished with standard, low-cost, low-voltage integrated circuit technologies. Embodiments of the invention use a differential switched capacitor integrator as a sample and hold circuit. The sample and hold circuit provides a high impedance load on the battery cells to avoid unnecessary power loss. The sample and hold circuit allows all of the cell voltages in the stack to be measured at the same point in time when the battery stack current is measured. This simultaneous measurement of cell voltage and stack current provides an accurate measurement of the output impedance of each battery cell. To withstand the high common mode voltages, the high common mode voltage is divided evenly across each monitor module. Therefore, each monitor module only sees the voltage of a limited number of battery cells. The voltage measurement is made at the cell level and is then converted to a current that is passed through the stack of monitor modules toward ground reference. Similarly, the monitor modules are addressed by a control signal that is passed through the stack of monitor modules from ground reference. The disclosed system has an advantage of minimizing the number of costly isolation channels that are required in the system.

Figure 1:
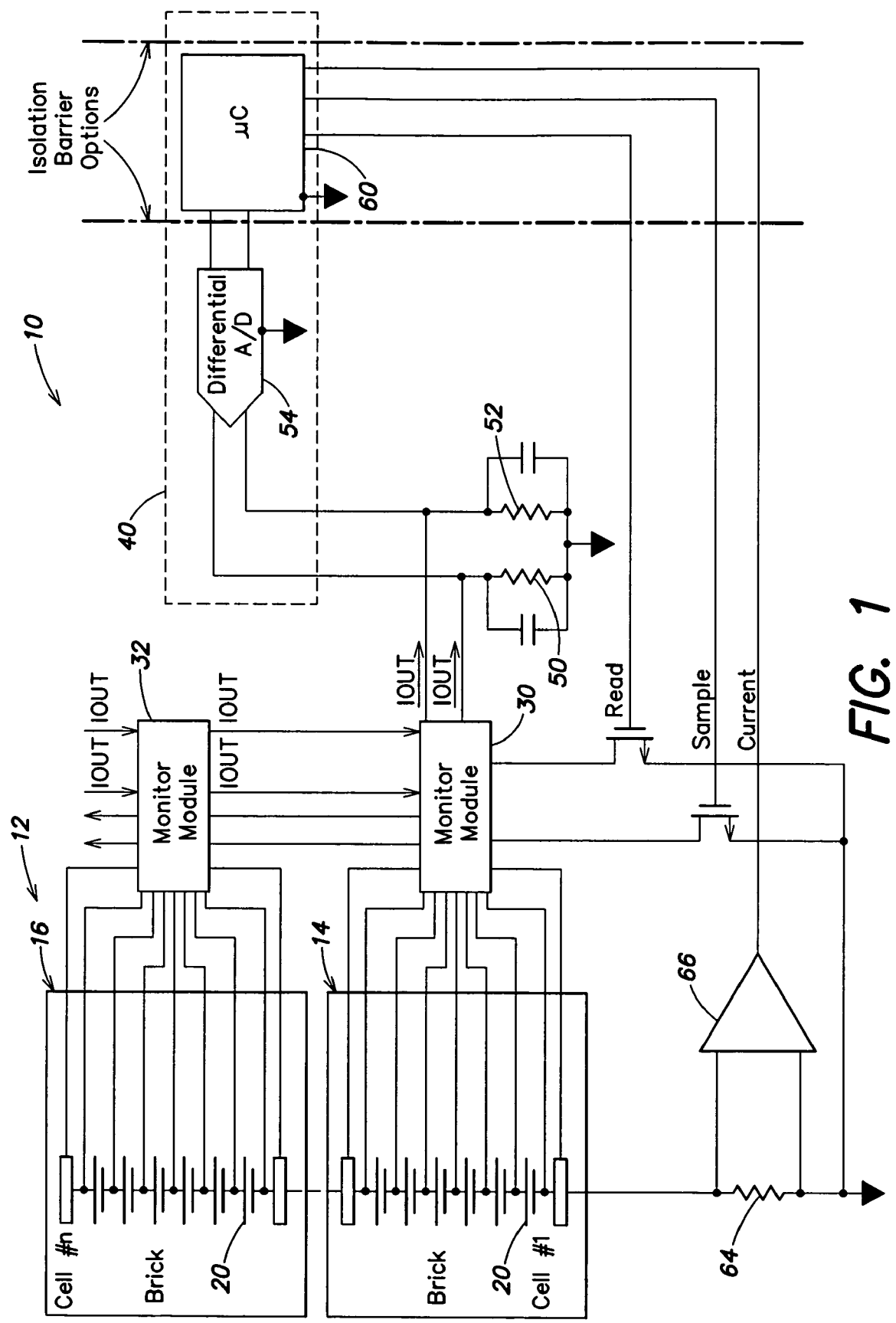
FIG. 1 is a schematic block diagram of a battery monitoring system in accordance with an embodiment of the invention.

A block diagram of a battery monitoring system 10 in accordance with an embodiment of the invention is shown in FIG. 1. A battery stack 12 to be monitored includes so-called "bricks", each of which includes a subset of the cells in the battery stack. In the example of FIG. 1, bricks 14 and 16 are shown. A typical battery stack may include multiple bricks. Each brick includes several cells 20 connected in series, and the bricks are connected in series to form the battery stack. In the example of FIG. 1, each brick 14, 16 includes six cells 20. It will be understood that different numbers of bricks and different numbers of cells per brick may be utilized in a particular battery stack. By way of example, the cells 20 may utilize lithium ion battery technology. The number of cells in the battery stack depends on the voltage of individual cells and the required voltage of the battery stack. The battery stack voltage may be positive or negative.

The battery monitoring system 10 includes a monitor module associated with each brick, and a system control unit. In the embodiment of FIG. 1, battery monitoring system 10 includes a monitor module 30 associated with brick 14, a monitor module 32 associated with brick 16 and a system control unit 40. Each monitor module receives operating power from the cells of the respective brick. Thus monitor module 30 receives operating power from brick 14, and monitor module 32 receives operating power from brick 16. In addition, the voltage of each cell in the brick is connected to the respective monitor module for monitoring as described below.

The monitor modules of the battery monitoring system are interconnected in a series or daisy-chain configuration. In the daisy-chain configuration, each monitor module is referenced to one of the bricks or subsets of cells of the battery stack, and signals are connected from one monitor module to another in sequence. The daisy-chain configuration permits each module to operate at the potential difference of the respective brick, even though the common mode voltage of a particular monitor module may be much higher than the rated voltage of the circuitry in the monitor module. Assume, for example, that brick 14 operates at 0 to 25 volts and brick 16 operates at 25 to 50 volts. Thus, monitor module 30 operates at 0 to 25 volts and monitor module 32 operates at 25 to 50 volts.

The control and readout signals are connected between monitor modules in the daisy-chain configuration to eliminate the need for multiple optical isolators or other isolation devices. In the daisy-chain configuration, each monitor module, except the monitor module at each end of the battery stack, has two adjacent monitor modules. As noted above, the battery stack voltage may be positive or negative. The connection of the control and readout signals in the daisy-chain configuration of monitor modules depends on the polarity of the battery stack.

In the usual case of a positive battery voltage, control signals are connected from system control unit 40 to the monitor module at ground reference and then to the adjacent higher voltage monitor module, and so on to the highest voltage monitor module. The readout signals in the case of a positive battery voltage are connected from the highest voltage monitor module to the adjacent monitor module of lower voltage and so on. Readout signals from the monitor module at ground reference are connected to system control unit 40.

In the case of a negative battery voltage, control signals are connected from system control unit 40 to the monitor module at ground reference and then to the adjacent lower voltage monitor module, and so on to the lowest voltage monitor module. Readout signals are connected from the lowest voltage monitor module to the adjacent higher monitor module and so on. Readout signals from the monitor module at ground reference are connected to system control unit 40.

As shown in FIG. 1, the control signals may include a sample signal which causes the voltages of all the cells in the battery stack to be measured substantially simultaneously. A read signal causes the measured cell voltages to be read out sequentially. The control signals may be digital signals. Typically, the measured cell voltages are read out in order beginning with the cell that is closest to ground reference. The readout signal may be an analog differential current connected between each monitor module in the daisy-chain configuration. As shown in FIG. 1, the differential output current of monitor module 30 is referenced to ground through resistors 50 and 52 and is connected to system control unit 40. In other embodiments, the readout signal may be an analog single-ended current, an analog voltage, or a digital signal.

System control unit 40 may include a differential analog-to-digital converter 54 and a microcontroller 60. Analog-to-digital converter 54 converts the readout signals to digital values and supplies the digital values to microcontroller 60. Microcontroller 60 performs calculations based on the measured cell voltages and the measured battery stack current. In addition, microcontroller 60 provides control signals, including a sample signal and a read signal, to the monitor modules.

In addition, a resistor 64 measures the current of battery stack 12. The voltage across resistor 64 is supplied through an amplifier 66 to microcontroller 60. The current of battery stack 12 is sampled at the same time as the voltages of each of the cells of battery stack 12 are sampled by monitor modules 30 and 32. Thus, microcontroller 60 can determine an internal impedance of each of the cells.

Figure 2:
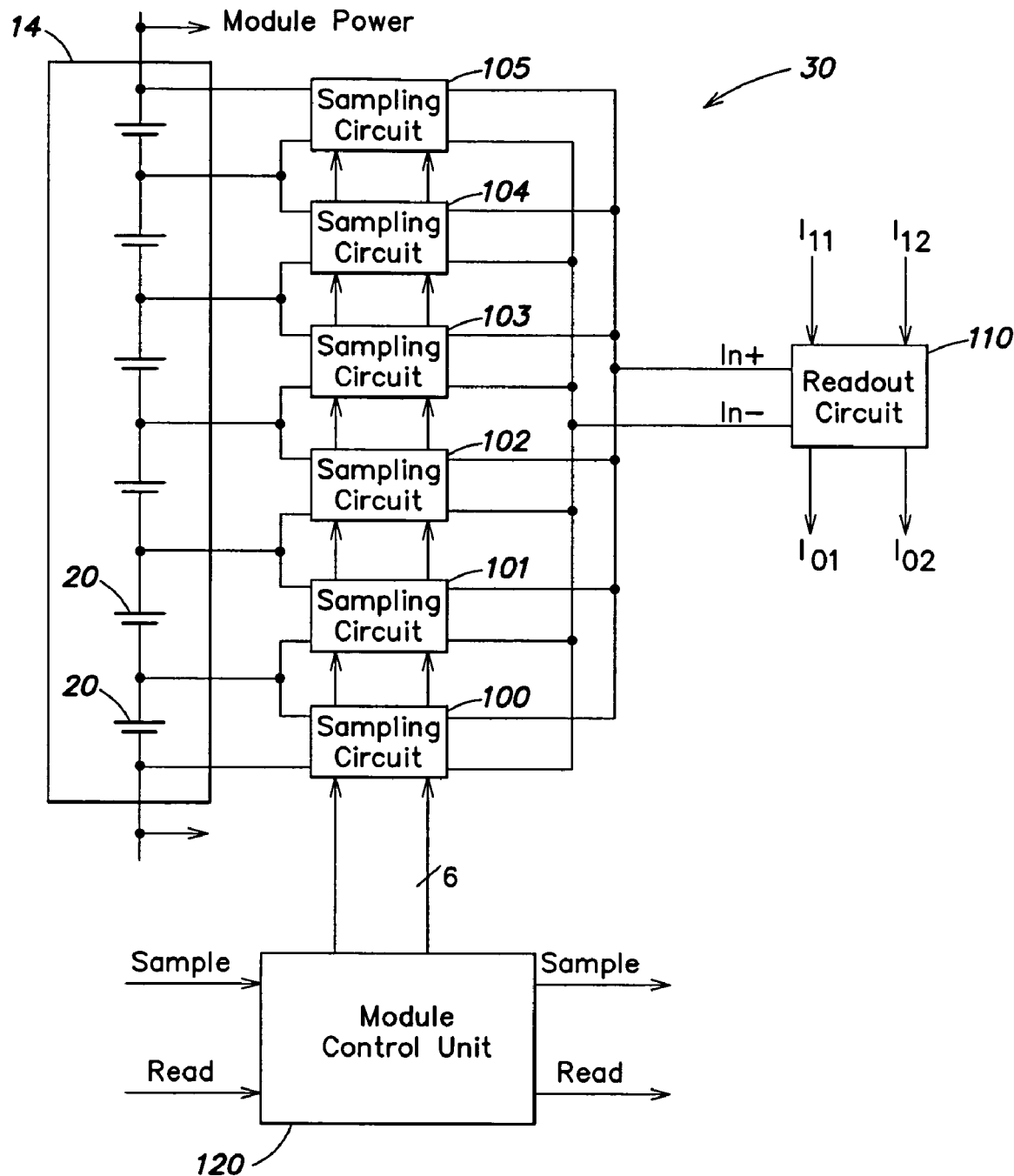
FIG. 2 is a schematic block diagram of a monitor module in accordance with an embodiment of the invention.

A block diagram of an embodiment of monitor module 30 is shown in FIG. 2. Each monitor module in the monitoring system may have the same configuration. A sampling circuit is provided to sample cell voltages of corresponding cells of at least a subset of the cells of the battery. The subset of cells typically corresponds to the cells in a brick. In the example of FIG. 2, each brick includes six cells. Thus, monitor module 30 includes sampling circuits 100, 101, 102, 103, 104 and 105. Each sampling circuit receives the cell voltage of a corresponding cell and provides a differential output to a readout circuit 110. Each of the sampling circuits receives a sample command to cause the sampling circuit to measure the voltage of the corresponding cell. Since the cell voltages are sampled simultaneously, a common sample command can be utilized.

Each sampling circuit also receives a read command to cause the measured cell voltage to be supplied to readout circuit 110. The measured cell voltages are read out of the sampling circuit sequentially, thus requiring separate read command lines. An addressing scheme could be utilized but would increase the complexity of the sampling and control circuits.

The readout circuit 110 converts the measured cell voltages to differential currents and supplies the differential currents to an adjacent monitor module in the daisy-chain configuration or to the analog-to-digital converter 54 in system control unit 40. The differential currents representative of cell voltages are supplied in the same sequence as they are read out from sampling circuits 100-105. Then, the adjacent monitor module (such as monitor module 32 in FIG. 1) is activated for readout. The measured cell voltages, converted to differential currents, are supplied from monitor module 32 to readout circuit 110 in monitor module 30. In the daisy-chain configuration, the differential currents are passed through the readout circuit 110 to the adjacent monitor module or to system control unit 40. In this manner, all of the measured cell voltages are read out in sequence and supplied as differential currents to system control unit 40.

A module control unit 120 provides simultaneous sample commands to the sampling circuits 100-105 and provides sequential read commands to the sampling circuits, in response to control signals. The control signals are received from the adjacent monitor module in the daisy-chain configuration or from the system control unit 40, depending on the position of the monitor module in the daisy-chain configuration. The read control signal may be a read clock that sequences through the sampling circuits of the battery monitoring system. The module control unit 120 may supply sample commands and the read clock to the adjacent monitor module in the daisy-chain configuration of the battery monitoring system 10.

Figure 3:
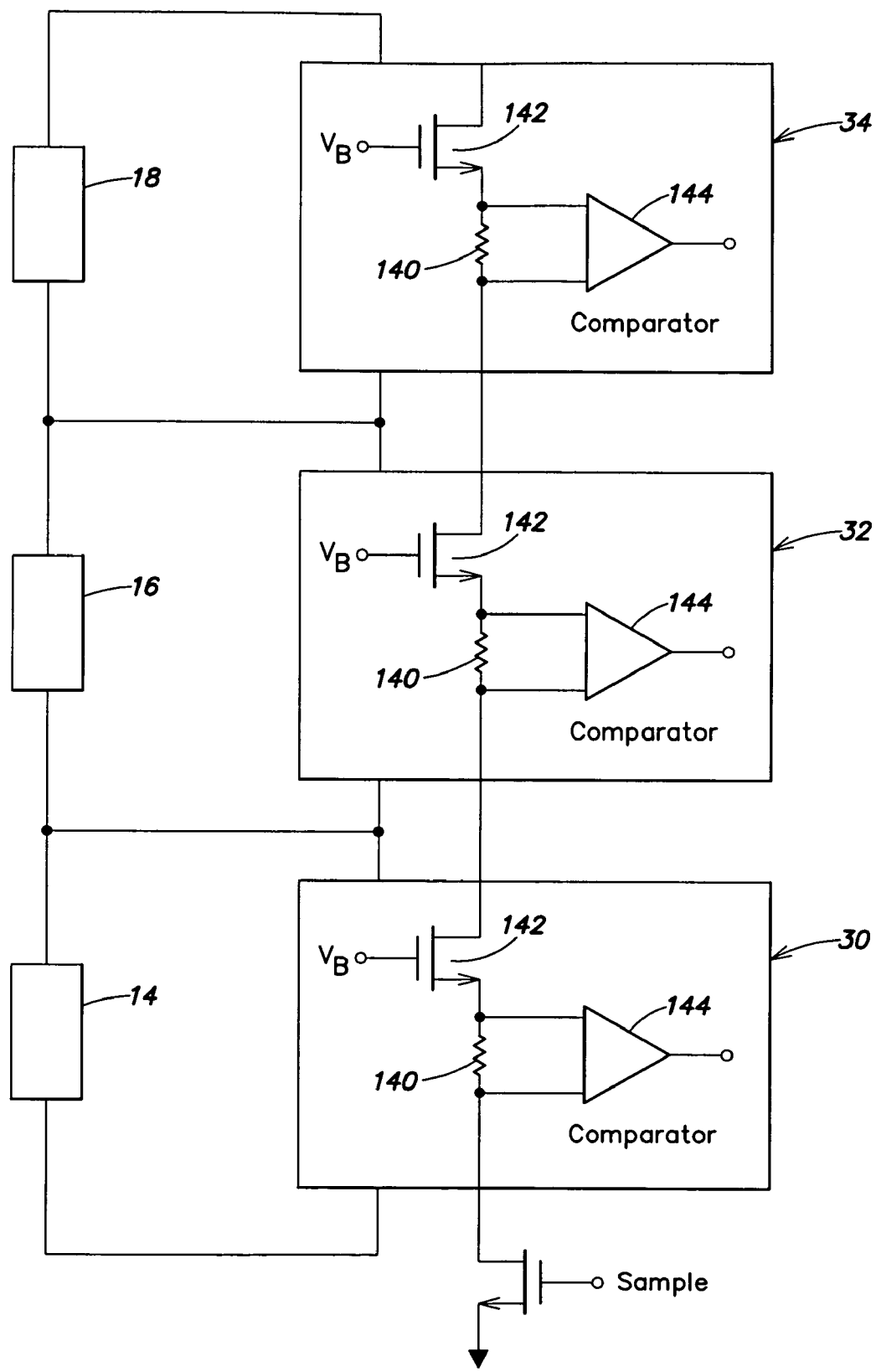
FIG. 3 is a schematic block diagram that illustrates an embodiment of a circuit for supplying a sample signal to monitor modules in a daisy-chain configuration.

A schematic diagram of an embodiment of the control circuitry in each monitor module associated with the sample signal is shown in FIG. 3. Monitor modules 30, 32, 34 are connected to bricks 14, 16, 18, respectively. Each monitor module includes a resistor 140, a transistor 142 and a comparator 144. The resistor 140 and the transistor 142 are connected in series within each monitor module, and the resistors and transistors are connected in series through each monitor module. The comparator 144 senses the voltage across resistor 140. The sample signal causes a current to flow through resistor 140 in each of the monitor modules. The voltage produced by the current changes the output state of comparator 144 in each of the monitor modules, causing the sampling circuits to measure all the cell voltages simultaneously. The circuitry in each monitor module, including resistor 140, transistor 142 and comparator 144, is required to withstand only the voltage of the corresponding brick.

Figure 4:
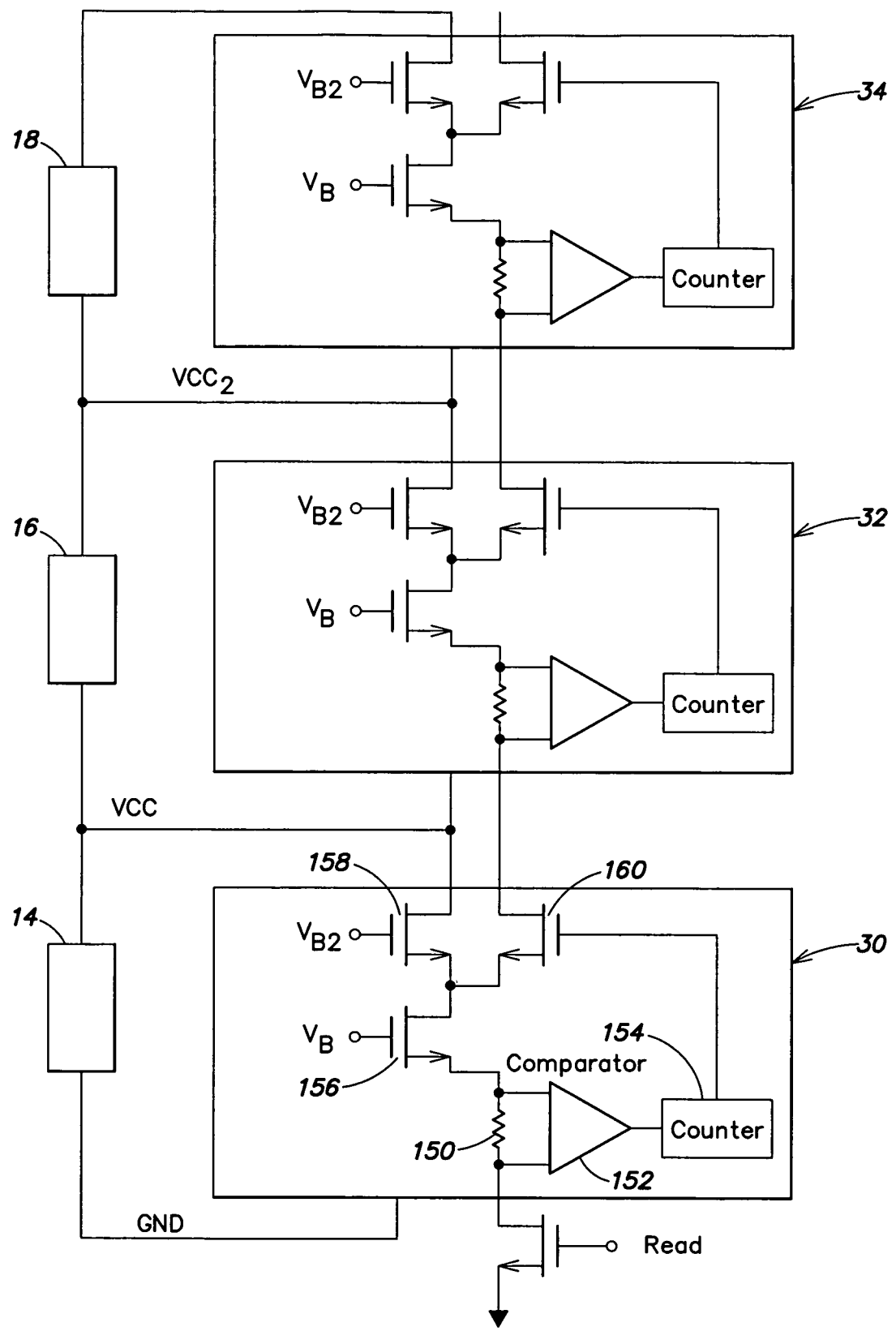
FIG. 4 is a schematic block diagram that illustrates an embodiment of a circuit for supplying a read signal to the monitor modules in the daisy-chain configuration.

A schematic diagram of an embodiment of the control circuitry in each monitor module associated with the read signal is shown in FIG. 4. Each monitor module includes a resistor 150, a comparator 152, a counter 154 and transistors 156, 158 and 160. When each read signal is received from system control unit 40, a current is drawn through resistor 150 and changes the output state of comparator 152, thereby incrementing counter 154. Counter 154 provides a read command to each sampling circuit in the monitor module in sequence. In addition, the read command may be supplied to the readout circuit 110 (FIG. 2) to enable the voltage-to-current converter. In the example described above, counter 154 provides six read commands for the six sampling circuits of the monitor module. Then, counter 154 turns on transistor 160, causing the read signal to be supplied to the adjacent monitor module. The above process is repeated for the adjacent monitor module, and so on for each monitor module in the stack. As a result, all sampling circuits are read out sequentially.

Figure 5:
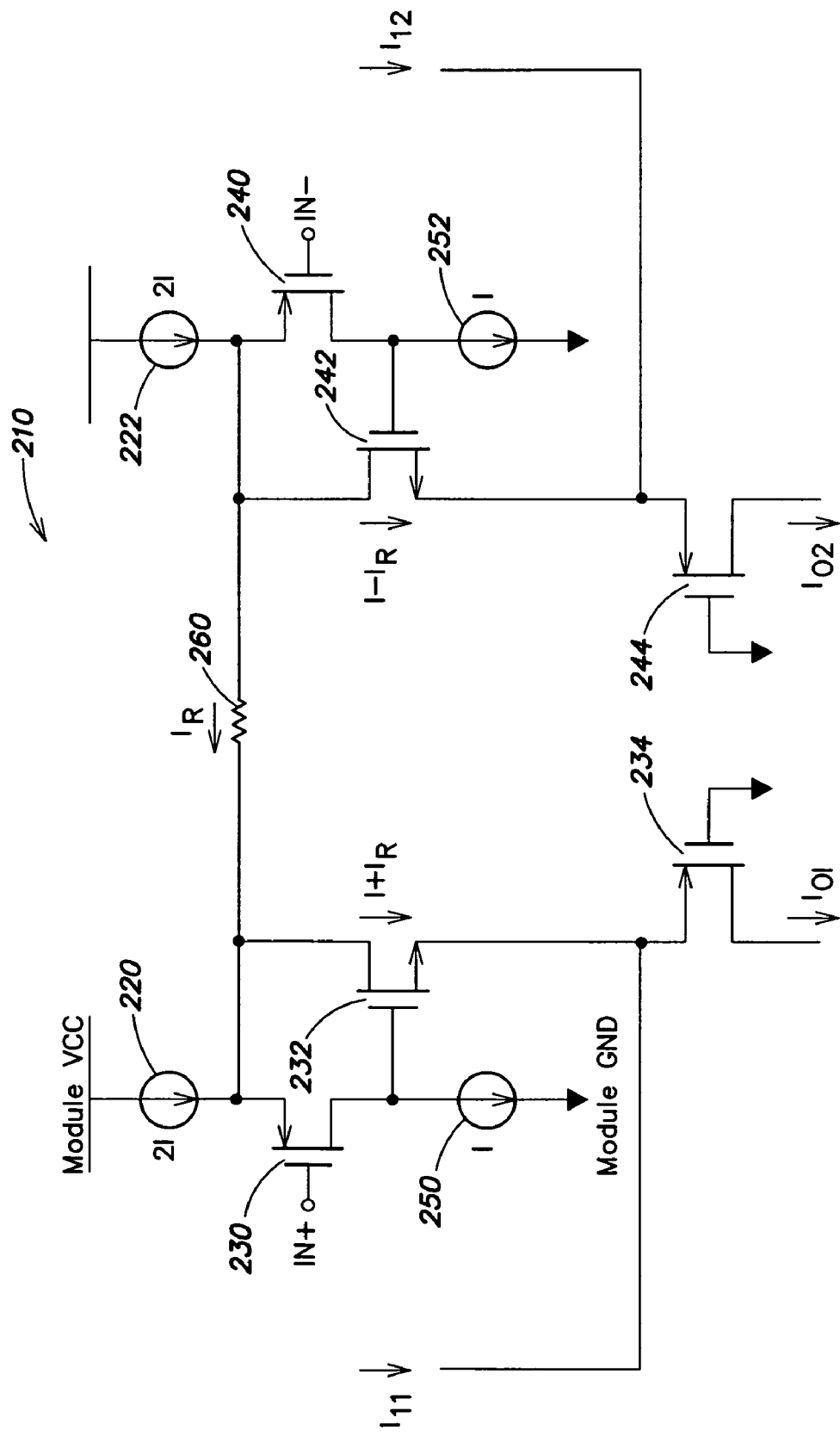
FIG. 5 is a schematic block diagram that illustrates an embodiment of a readout circuit.

A schematic diagram of an embodiment of readout circuit 110 (FIG. 2) is shown in FIG. 5. A voltage-to-current converter 210 receives IN+ and IN− signals from sampling circuits 100-105 (FIG. 2). Voltage-to-current converter 210 may be a differential circuit including current sources 220 and 222, transistors 230, 232, 234, 240, 242 and 244, and current sources 250 and 252. A resistor 260 is connected between the sources of transistors 230 and 240. A differential voltage at inputs IN+ and IN− causes a current $I_R$ to flow through resistor 260. It can be shown that the difference between output currents $I_{o1}$ and $I_{o2}$ is equal to $2I_R$. As a result, the differential output current represents the measured cell voltage.

The differential currents $I_{o1}$ and $I_{o2}$ are supplied to the adjacent monitor module or to the system control unit 40. In addition, voltage-to-current converter 210 receives currents $I_{11}$ and $I_{12}$ from the previous monitor module in the daisy-chain configuration and supplies those currents as outputs to the next monitor module. As noted above, the sampling circuits are read out sequentially, and only one sampling circuit is read out at a given time. When readout signals are being provided from other monitor modules, the voltage-to-current converter 210 is either turned off or its currents are diverted from transistors 234 and 244. As a result, transistors 234 and 244 pass readout signals through to the next monitor module in the daisy-chain configuration.

Figure 6:
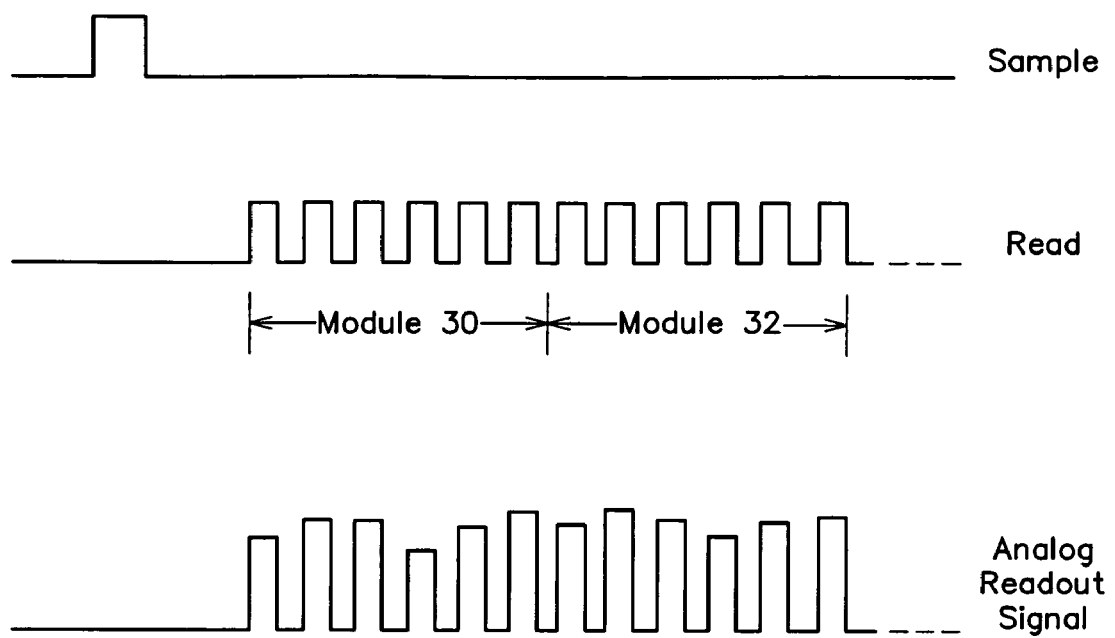
FIG. 6 is a timing diagram that illustrates operation of the battery monitoring system.

A timing diagram that illustrates operation of the battery monitoring system is shown in FIG. 6. A sample signal is first supplied to all the monitor modules, and the voltages of all the cells in the battery stack are measured substantially simultaneously. At the same time, the current of battery stack 12, as sensed by resistor 64 in FIG. 1, is supplied to system control unit 40. Then, the read clock causes the measured cell voltages to be read out from the monitor modules sequentially. In the example of FIG. 6, the six measured cell voltages of monitor module 30 are read out, followed by the six measured cell voltages of monitor module 32, and so on. The readout signal is an analog differential current, the magnitude of which represents each measured cell voltage. After all measured cell voltages have been read out, the process is repeated at intervals, for example, of 100 milliseconds.

The monitor module has been described in connection with the function of measuring and reading out cell voltages. Additional functions can be provided within the scope of the present invention. In some embodiments, the monitor module can be used to perform one or more control functions, such as control of the corresponding brick, in response to control signals. For example, cell balance can be controlled by the monitor module in response to control signals supplied from system control unit 40. In addition, the monitor module can be used to measure any desired parameter of the brick. One example is to measure the output of a temperature sensor, such as a thermistor, and to read out the measured temperature to system control unit 40.

In further embodiments, the monitor module may have a low power mode for saving power during inactive periods. By way of example only, the monitor module may automatically switch from a normal mode to the low power mode if no control signals are received for a predetermined time period. The monitor module may be switched back to the normal mode if any control signals are received.

In additional embodiments, the monitor module may include one or more diagnostic functions to verify that the monitor module is functioning properly. For example, a reference voltage generated in the monitor module can be measured and read out to system control unit 40, either at known intervals or in response to appropriate control signals supplied by system control unit 40. It will be understood that a variety of diagnostic functions may be utilized.

An implementation of a monitor module 300 in accordance with an embodiment of the invention is shown in FIGS. 7-10. Like elements in FIGS. 1-10 have the same reference numerals. Monitor module 300 may correspond to the monitor modules 30, 32, 34 described above.

Figure 7:
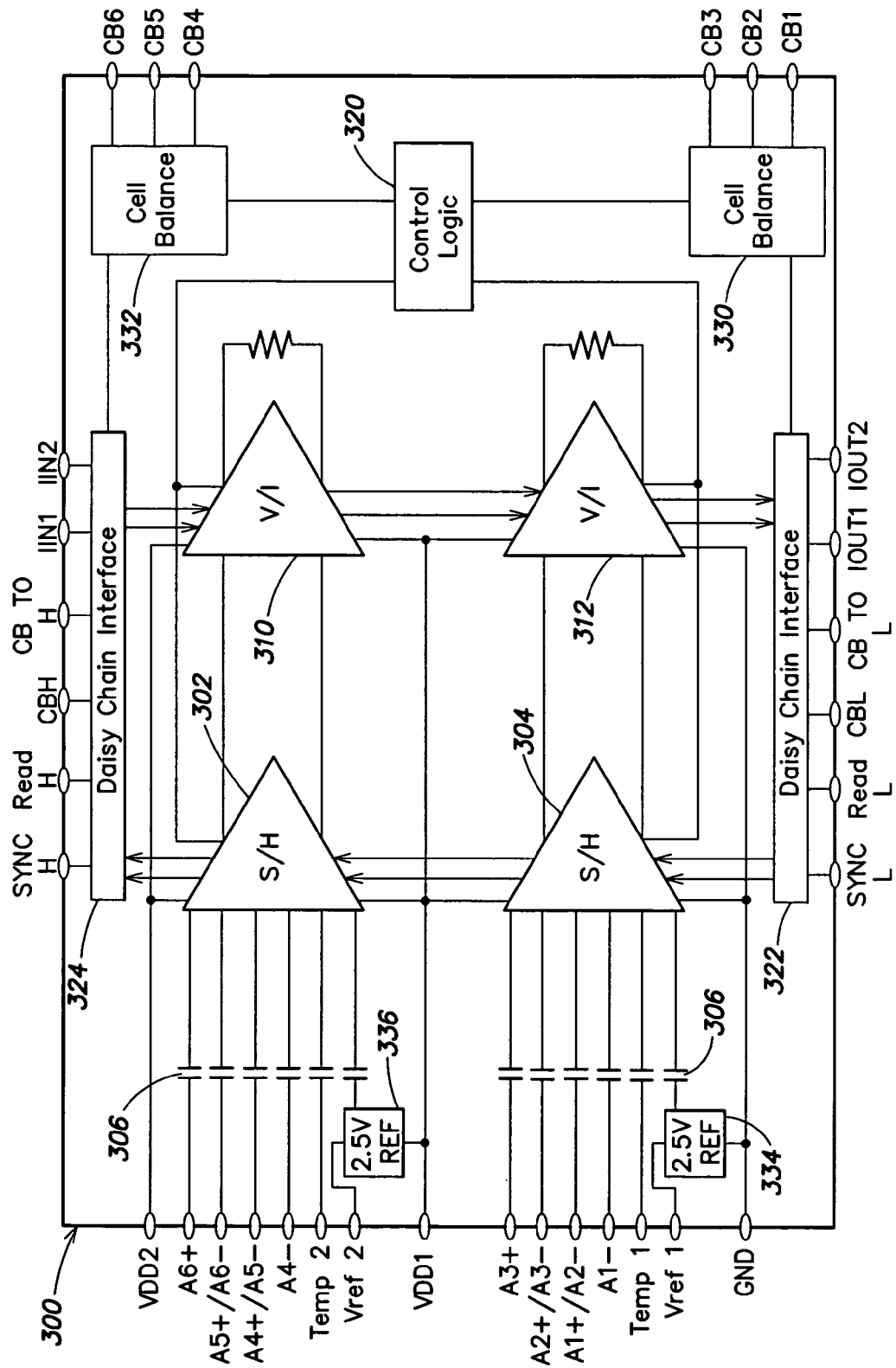
FIG. 7 is a schematic block diagram of an implementation of a monitor module in accordance with an embodiment of the invention.

Referring to FIG. 7, a monitor module 300 includes sample-and-hold circuits 302 and 304, each of which samples the voltages of three cells. In addition, sample-and-hold capacitors 306 are provided at the inputs to sample-and-hold circuits 302 and 304. The outputs of sample-and-hold circuits 302 and 304 are provided to voltage-to-current converters 310 and 312, respectively, which provide differential output currents IOUT1 and IOUT2. The voltage-to-current converter 310 receives differential input currents IIN1 and IIN2 from an adjacent monitor module. The module control logic includes control logic 320, a low daisy chain interface 322 to connect to an adjacent lower voltage monitor module or to the system control unit, and a high daisy chain interface 324 to connect to an adjacent higher voltage monitor module. Monitor module 300 further includes cell balance control units 330 and 332, and 2.5 volt reference voltages 334 and 336.

Figure 8:
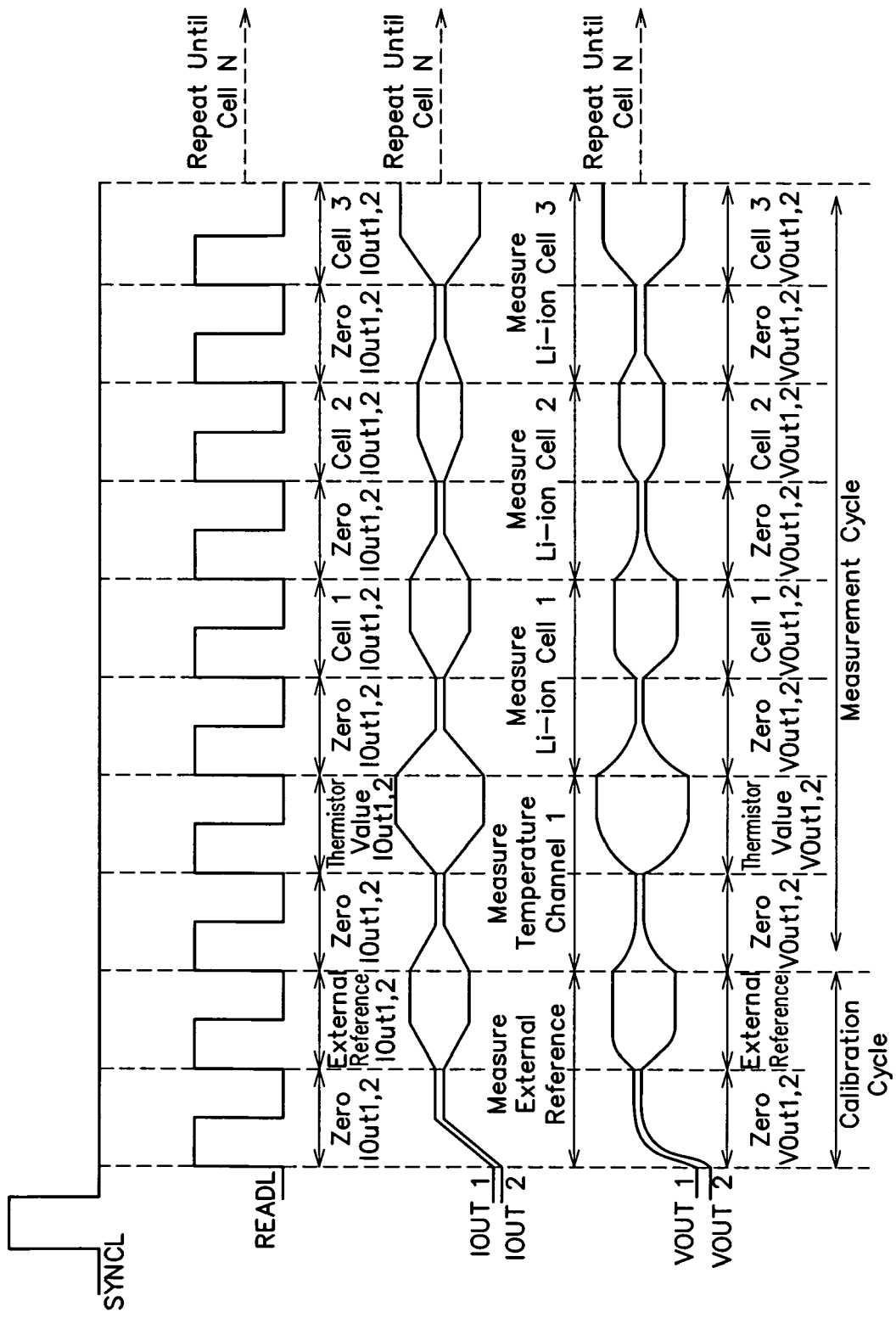
FIG. 8 is a timing diagram that illustrates operation of the monitor module of FIG. 7.

Monitor module timing is described with reference to the timing diagram of FIG. 8. A digital control signal SYNCL received from the system control unit samples all cell voltages on its falling edge. The control signal SYNCL corresponds to the sample signal described above. The cell voltages are stored in the sample-and-hold capacitors 306. A read clock READL provided by the system control unit samples the reference voltage for system calibration, followed by a measurement of a thermistor voltage. Then, the cell voltages stored in the sample-and-hold circuits 302 and 304 are read out in series to provide differential output currents IOUT1 and IOUT2. The differential output currents are proportional to the cell voltages and to the thermistor and reference voltages. Differential voltages VOUT1 and VOUT2 in FIG. 8 represent the voltages across the external resistors 50 and 52 shown in FIG. 1.

Figure 9A:
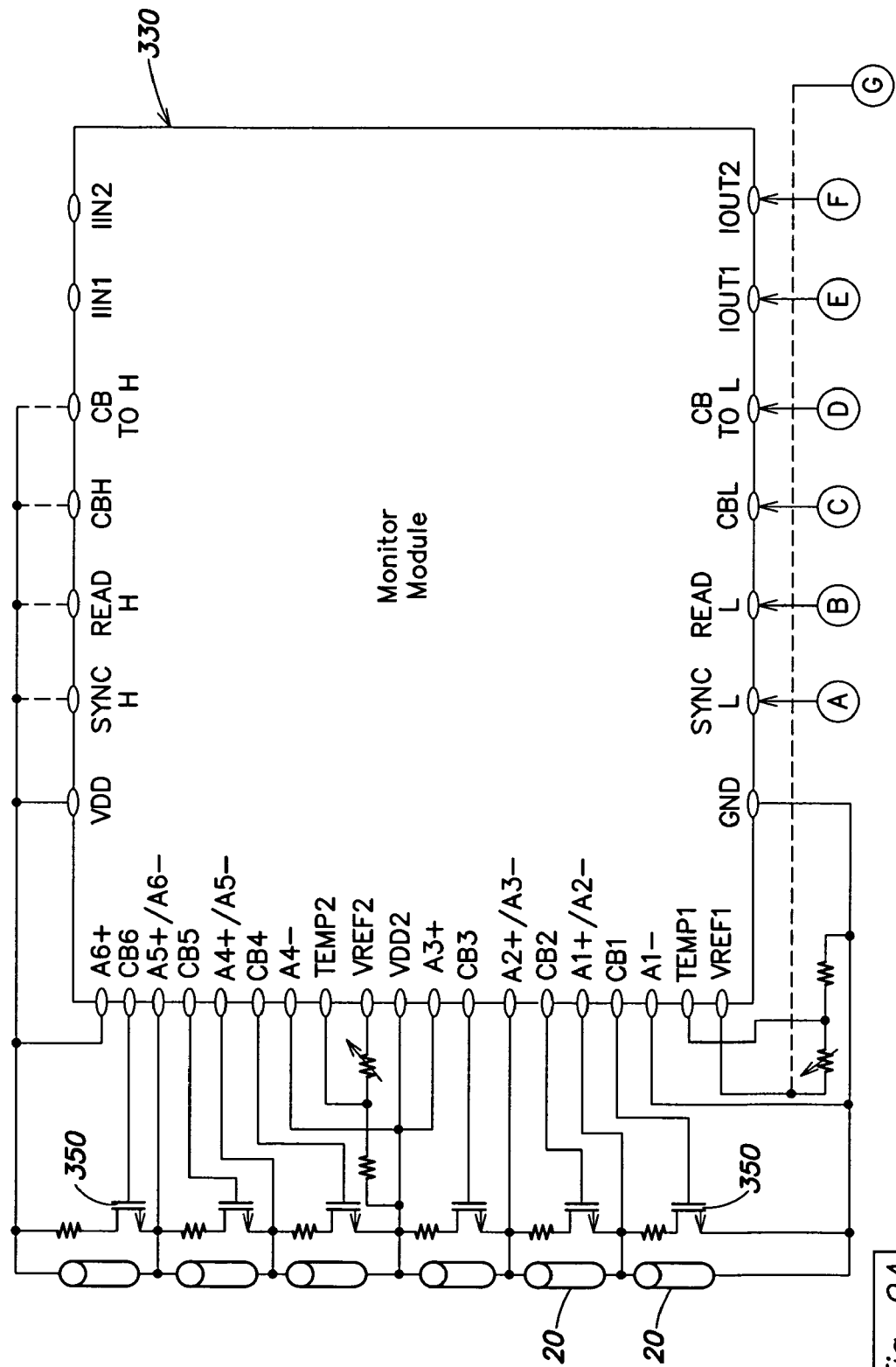
FIG. 9 is a schematic block diagram of a battery monitoring system that illustrates the cell balance function in accordance with an embodiment of the invention.
Figure 9B:
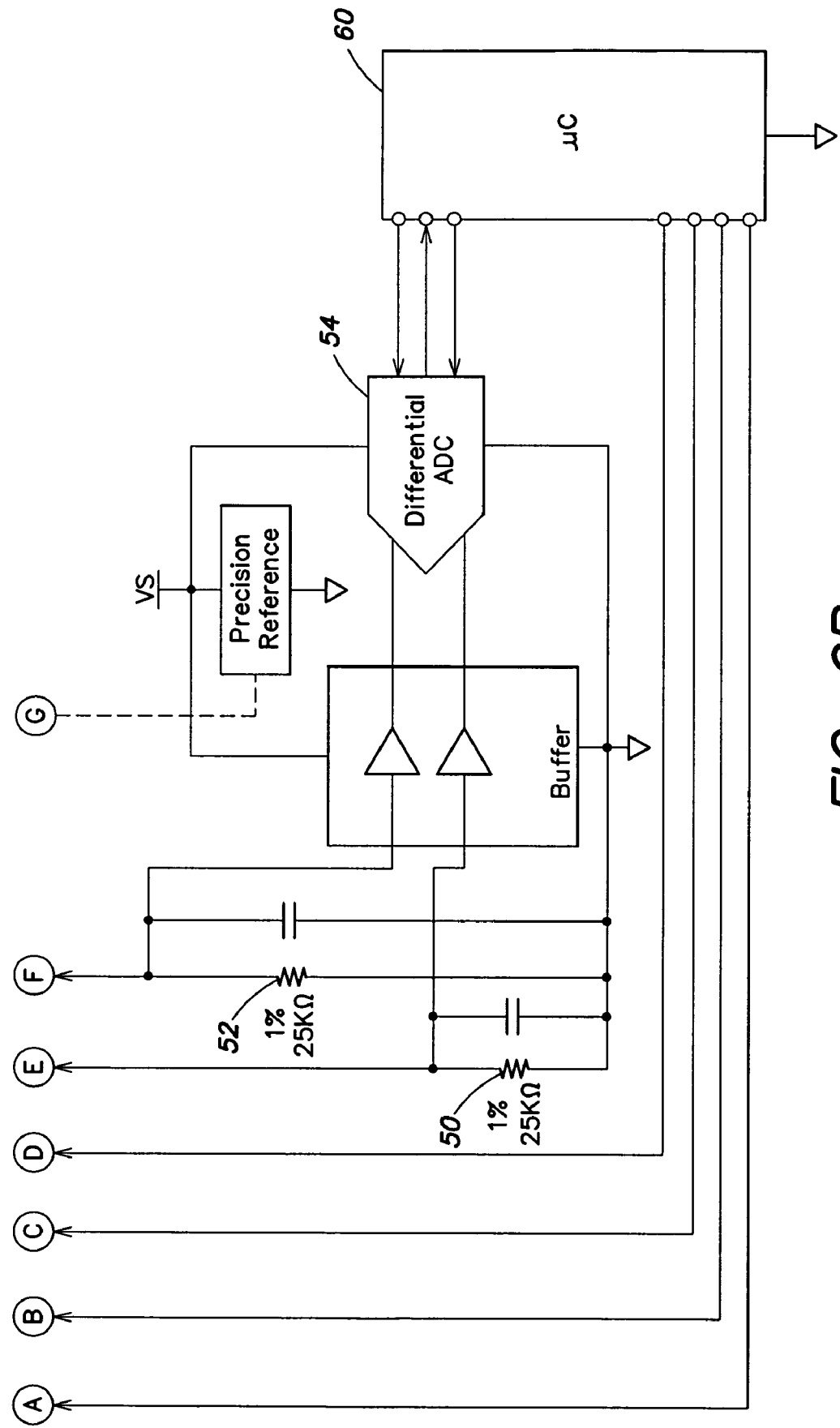

The cell balance function of monitor module 300 is described with reference to FIGS. 9 and 10. Cell balancing is accomplished by control of external FETs 350 connected to pins CB1-CB6 and logic signals CBL and CBTOL provided to the monitor module 300 by the system control unit. The control signals provide a logic high output at pins CB1-CB6, based on which cell requires charge balancing.

Figure 10:
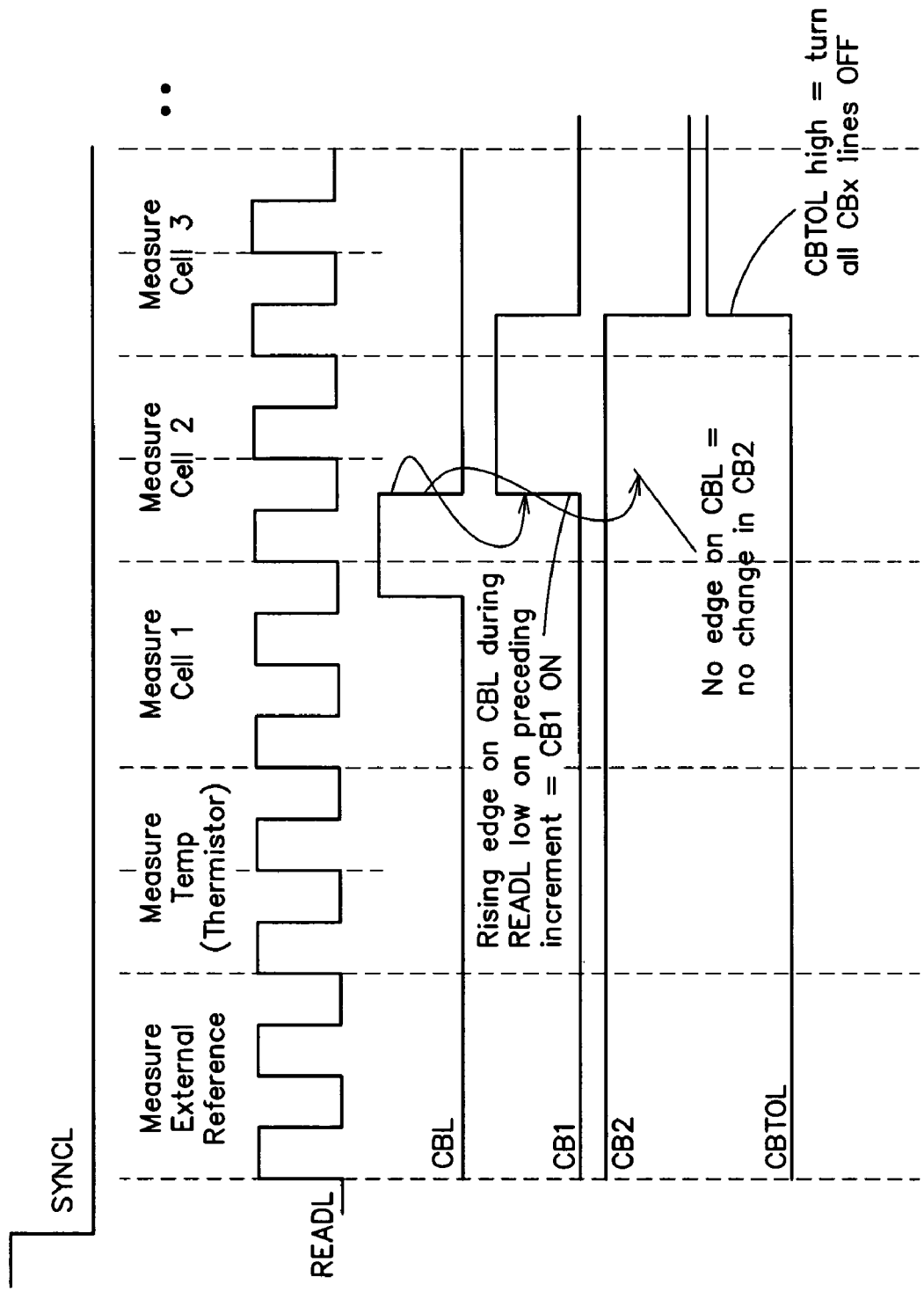
FIG. 10 is a timing diagram that illustrates operation of the cell balance function.

Referring to FIG. 10, the control signal SYNCL is brought low and the read clock READL is started. When the read clock READL reaches the third low cycle, which corresponds to initiating a measurement of cell 1, a rising edge on control signal CBL sets cell balance output CB1 high. When there is no rising edge on control signal CBL, the cell balance output is not turned on and no charge balancing is performed for that cell. The control signal CBTOL resets all cell balance lines CB1-CB6 low.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A battery monitoring system to monitor a battery stack having multiple cells connected in series, comprising:

monitor modules to monitor respective subsets of the cells of the battery stack, each monitor module, in response to one or more control signals, measuring cell voltages of the respective subset of cells and providing at least one readout signal that represents the sampled cell voltages, the monitor modules being electrically connected in a stack such that each monitor module is referenced to the voltage of the respective subset of cells, and the control signals and the readout signal are connected through each of the monitor modules of the stack; and a system control unit to provide the control signals to the monitor modules and to receive the readout signal from the monitor modules.

2. A battery monitoring system as defined in claim 1, wherein each of the monitor modules comprises:

sampling circuits to sample cell voltages of corresponding cells of the subset of cells;

a readout circuit to receive the sampled cell voltages of the corresponding cells of the subset of cells and to provide at least the one readout signal that represents the sampled cell voltages; and a module control unit to provide simultaneous sample commands to the sampling circuits and to provide sequential read commands to the sampling circuits and the readout circuit, in response to the control signals.

3. A battery monitoring system as defined in claim 1, wherein each monitor module is configured to supply the control signals to an adjacent monitor module in the stack.

4. A battery monitoring system as defined in claim 2, wherein each of the sampling circuits comprises a switched capacitor sampling circuit.

5. A battery monitoring system as defined in claim 1, wherein each of the monitor modules is powered by the respective subset of cells of the battery stack.

6. A battery monitoring system as defined in claim 1, wherein each of the monitor modules is configured to perform one or more control functions in response to control signals.

7. A battery monitoring system as defined in claim 1, wherein each of the monitor modules is configured to operate in a low power mode during inactive periods.

8. A battery monitoring system as defined in claim 1, wherein each of the monitor modules is configured to perform one or more diagnostic operations to verify proper functioning.

9. A battery monitoring system as defined in claim 1, wherein the readout signal comprises a differential current readout signal that represents sampled cell voltages.

10. A battery monitoring system as defined in claim 1, wherein the readout signal comprises an analog readout signal that represents sampled cell voltages.

11. A method for monitoring a battery stack having multiple cells connected in series, comprising:

providing monitor modules to monitor respective subsets of the cells of the battery stack;

referencing each monitor module to the voltage of the respective subset of cells; and connecting control signals and readout signals serially through each of the monitor modules.

12. A method as defined in claim 11, wherein connecting control signals and readout signals serially through the monitor modules comprises supplying differential current readout signals representative of monitored voltages of respective cells of the battery stack.

13. A method as defined in claim 11, wherein connecting control signals and readout signals serially through the monitor modules comprises supplying analog readout signals representative of monitored voltages of respective cells of the battery stack.

14. A method as defined in claim 11, further comprising controlling cell balance in the cells of the battery stack.

15. A method as defined in claim 11, further comprising performing one or more control functions in response to the control signals.

16. A method as defined in claim 11, further comprising operating each monitor module in a low power mode during inactive periods.

* * * * *